United States Patent
Kim

(10) Patent No.: US 6,950,637 B2
(45) Date of Patent: Sep. 27, 2005

(54) POWER RATE ENHANCEMENT CIRCUIT FOR AN RF POWER AMPLIFIER IN A DUAL MODE MOBILE PHONE

(75) Inventor: Hark-Soo Kim, Kyonggi-do (KR)

(73) Assignee: Samsung Electronics Co., Ltd. (KR)

( * ) Notice: Subject to any disclaimer, the term of this patent is extended or adjusted under 35 U.S.C. 154(b) by 682 days.

(21) Appl. No.: 09/997,503

(22) Filed: Nov. 19, 2001

(65) Prior Publication Data

US 2002/0132596 A1 Sep. 19, 2002

(30) Foreign Application Priority Data

Jan. 20, 2001 (KR) .......................................... 2001-3387

(51) Int. Cl.$^7$ ................................................. H04B 1/04
(52) U.S. Cl. .................... 455/127.4; 455/121; 455/129; 455/132
(58) Field of Search ........................... 455/127.1, 127.4, 455/127.6, 552.1, 553.1, 82, 83, 132, 129, 121, 127.5

(56) References Cited

U.S. PATENT DOCUMENTS

| | | | | |
|---|---|---|---|---|
| 5,880,631 A | * | 3/1999 | Sahota | ......................... 330/51 |
| 6,128,508 A | * | 10/2000 | Francisco et al. | ......... 455/552.1 |
| 6,188,877 B1 | * | 2/2001 | Boesch et al. | ................. 455/74 |
| 6,300,827 B1 | * | 10/2001 | King | ............................. 330/65 |
| 6,313,698 B1 | * | 11/2001 | Zhang et al. | .................. 330/51 |
| 6,317,608 B1 | * | 11/2001 | Glocker | .................... 455/553.1 |
| 6,389,269 B1 | * | 5/2002 | Nanni et al. | .................. 455/93 |
| 6,606,483 B1 | * | 8/2003 | Baker et al. | ................. 455/126 |

* cited by examiner

*Primary Examiner*—Binh Tieu
*Assistant Examiner*—Tuan Pham
(74) *Attorney, Agent, or Firm*—Dilworth & Barrese LLP

(57) ABSTRACT

There is provided a power rate enhancement circuit for a power amplifier in a dual mode mobile phone including an RF power amplifier for amplifying an RF input signal, a duplexer connected to an antenna, and an isolator connected to the duplexer. The power enhancement circuit also comprises: a CDMA matching circuit connected to an output end of the RF power amplifier, for matching an output impedance of the RF power amplifier in a CDMA mode of operation; an AMPS matching circuit connected to the output end of the RF power amplifier, for matching the output impedance of the RF power amplifier in an AMPS mode of operation; and an RF switch for selecting the CDMA matching circuit or the AMPS matching circuit according to a mode control signal. The CDMA matching circuit comprises an inductor connected between the output end of the RF power amplifier and the isolator. The AMPS matching circuit comprises a capacitor connected between the RF switch and a contact point formed between the inductor and the isolator.

8 Claims, 4 Drawing Sheets

POWER RATE ENHANCEMENT CIRCUIT FOR AN RF POWER AMPLIFIER IN A DUAL MODE MOBILE PHONE

PRIORITY

This application claims priority to an application entitled "Power Rate Enhancement Circuit for RF Power Amplifier in a Dual Mode Mobile Phone" filed in the Korean Industrial Property Office on Jan. 20, 2001 and assigned Ser. No. 2001-3387, the contents of which are hereby incorporated by reference.

BACKGROUND OF THE INVENTION

1. Field of the Invention

The present invention relates generally to a dual mode mobile phone, and in particular, to a circuit for maximizing a power rate of an RF (Radio Frequency) power amplifier.

2. Description of the Related Art

In a mobile phone, an RF power amplifier consumes much more power than other elements. Therefore, the RF power amplifier chiefly causes a reduction in battery run-time and it generates heat.

In addition, in dual mode phones, when the mobile phone switches its operation mode from an analog communication mode to a digital communication mode, the RF power amplifier is required to have high linearity.

The increase in linearity of the RF power amplifier causes a decrease in power rate, thereby causing a reduced battery run-time problem and a heat generation problem in the mobile phone.

In general, a dual mode mobile phone supporting both a CDMA (Code Division Multiple Access) mode (or a digital communication mode) and an AMPS (Advanced Mobile Phone Service) mode (or an analog communication mode) shares one RF power amplifier for the two modes. That is, an RF power amplifier for the CDMA mode is also used in the AMPS mode, to cut down the cost and the size of the mobile phone. However, when used in the AMPS mode, the RF power amplifier for the CDMA mode has a lower power rate, as compared with the RF power amplifier for the AMPS mode. Actually, the RF power amplifier for the CDMA mode has a power rate of about 30%, while the RF power amplifier for the AMPS mode has a power rate of over 50%. However, when used in the AMPS mode, the RF power amplifier for the CDMA mode has a power rate of 35–40% at most. This great reduction in efficiency of the RF power amplifier during AMPS mode is required in the prior art if reduction on cost and size is desired.

In addition, RF power amplifiers are classified according to the modulation mode. An RF power amplifier with a Model No. RI23124, though it is an RF power amplifier for the CDMA mode, can also be used in the AMPS mode. This RF power amplifier has an output power of 4 dBm to 30 dBm in the AMPS mode, whereas it has an output power of −50 dBm to 30 dBm in the CDMA mode. Further, the RF power amplifier discontinuously operates at full, ½, ¼ or ⅛ rate, according to the traffic conditions. Therefore, when operating in the AMPS mode, this RF power amplifier generates a great deal of heat and, thereby consumes a great deal of power.

However, the RF power amplifier does not require a high level of linearity when operating in the AMPS mode, as compared with the case when operating in the CDMA mode. Therefore, when it is possible to increase the power rate to some extent it is preferable to share the RF power amplifier between the AMPS and CDMA operating modes.

SUMMARY OF THE INVENTION

It is, therefore, an object of the present invention to provide a power rate enhancement circuit for maximizing a power rate of an RF power amplifier, which is utilized in two different operation modes in a dual mode mobile phone.

To achieve the above and other objects, there is provided a power rate enhancement circuit for a power amplifier in a dual mode mobile phone including an RF power amplifier for amplifying an RF input signal, a duplexer connected to an antenna, and an isolator connected to the duplexer. The power enhancement circuit also comprises: a CDMA matching circuit connected to an output end of the RF power amplifier, for matching an output impedance of the RF power amplifier in a CDMA mode of operation; an AMPS matching circuit connected to the output end of the RF power amplifier, for matching the output impedance of the RF power amplifier in an AMPS mode of operation; and an RF switch for selecting the CDMA matching circuit, and the AMPS matching circuit, according to a mode control signal.

Preferably, the CDMA matching circuit comprises an inductor connected between the output end of the RF power amplifier and the isolator.

Preferably, the AMPS matching circuit comprises a capacitor connected between the RF switch and a contact point formed between the inductor and the isolator.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

The characteristics of an RF power amplifier chiefly depend on the neighboring circuits. Here, the "neighboring circuits" refer to a power supply circuit and an input/output impedance circuit. That is, the characteristics of the RF power amplifier chiefly depend on the input/output impedance. In addition, the power rate and the linearity characteristic chiefly depend on a matching state of the output impedance.

In general, high linearity-oriented matching is different from high power rate-oriented matching.

Therefore, by performing high linearity-oriented matching in the CDMA mode and high power rate-oriented matching in the AMPS mode, the mobile phone can optimally operate, no matter which operation mode is being utilized by the mobile phone operating, whether it is in the CDMA mode or the AMPS mode, thereby making it possible to extend the battery run-time of the mobile phone and reduce the heat it generates. A power rate enhancement circuit, according to an embodiment of the present invention, enhances the power rate in the AMPS mode by properly controlling an output impedance of the RF power amplifier.

Figure 1:
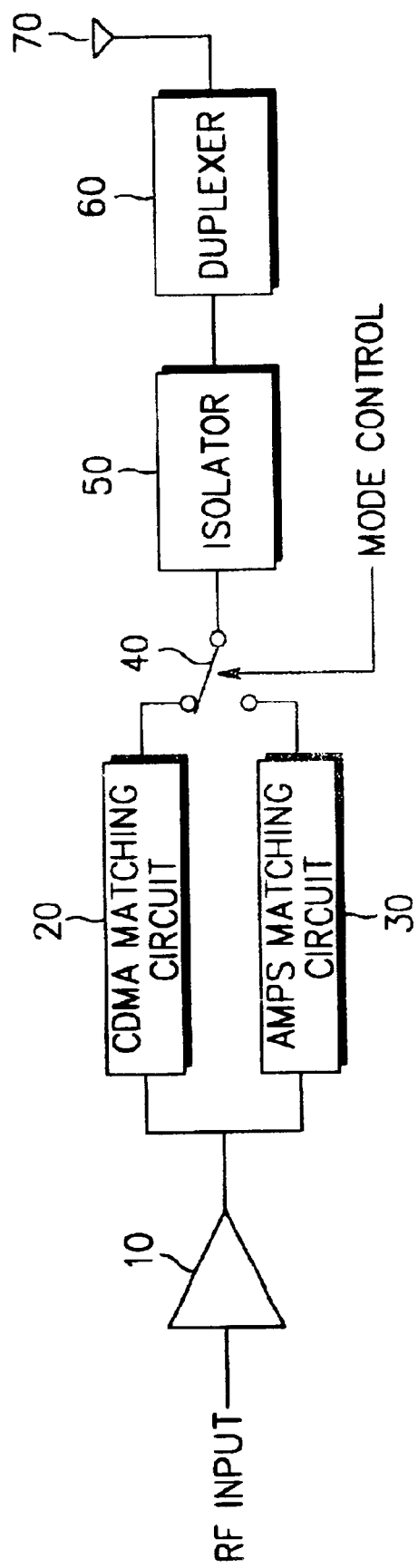
FIG. 1 is a block diagram illustrating a power rate enhancement circuit for an RF power amplifier in a dual mode mobile phone, according to an embodiment of the present invention.

FIG. 1 illustrates a power rate enhancement circuit for an RF power amplifier in a dual mode mobile phone, according to an embodiment of the present invention.

Referring to FIG. 1, the power rate enhancement circuit comprises: an RF power amplifier 10, a CDMA matching circuit 20, an AMPS matching circuit 30, an RF switch (or SPDT (Single-Pole-Double-Throw) switch) 40, an isolator 50, a duplexer 60 and an antenna 70. The RF switch 40 can be implemented by a mechanical switch, a field effect transistor (FET) or a diode. The elements 10, 50, 60 and 70 constitute the general transmission circuit.

As illustrated, the CDMA matching circuit 20 and the AMPS matching circuit 30, both having high linearity, are connected between the RF power amplifier 10 and the RF switch 40. The RF switch 40 is switched, according to a mode control signal generated by a controller of the mobile telephone.

The dual mode mobile phone with the novel power rate enhancement circuit selects the matching circuit having high linearity in the CDMA mode, thus maintaining the high linearity for a CDMA input signal. Further, the dual mode mobile phone with the novel power rate enhancement circuit selects the matching circuit, having a high power rate in the AMPS mode, thus maintaining the high power rate for an AMPS input signal.

Since it is allowable that the linearity in the AMPS mode is lower than that in the CDMA mode, the circuit can enhance the power rate without distortion of the linearity characteristic.

The CDMA RF signal and the AMPS RF signal have different characteristics. Now, a solution of the heat generation problem will be described separately for the AMPS mode and the CDMA mode.

Figure 2:
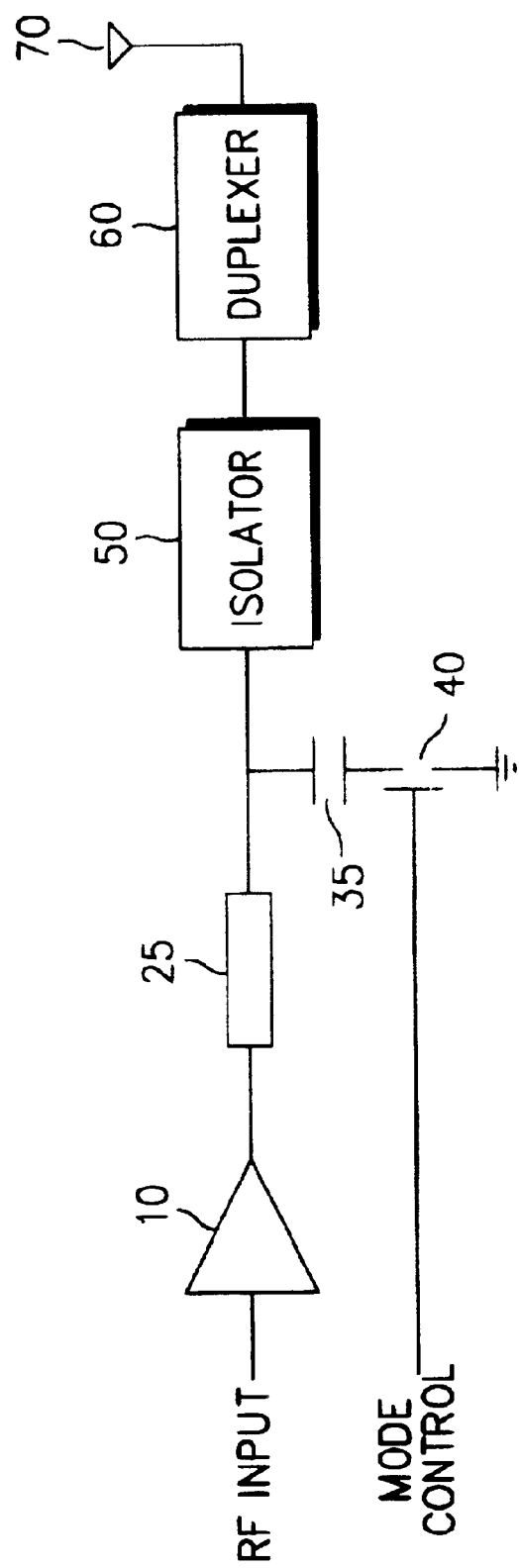
FIG. 2 is a detailed circuit diagram of the circuit of FIG. 1.

FIG. 2 illustrates the detailed structure of the power rate enhancement circuit of FIG. 1. An RF power amplifier, Model No. RI23124 by Conexant, USA, is designed to maximize the amount of power rate it receives from the input of a CDMA signal while minimizing distortion of the CDMA signal. However, this RF power amplifier has a lower power rate than that of an RF power amplifier for the AMPS mode.

Those of ordinary skill in the art recognize that any RF power amplifier, which utilizes the components recited in FIG. 1 may be utilized by this invention. To make up for this shortcoming, the invention varies a load impedance of the RF power amplifier. In other words, since the frequency modulation (FM) does not require so much high linearity of the RF power amplifier, the invention maximizes the power rate of the RF power amplifier.

Figure 3:
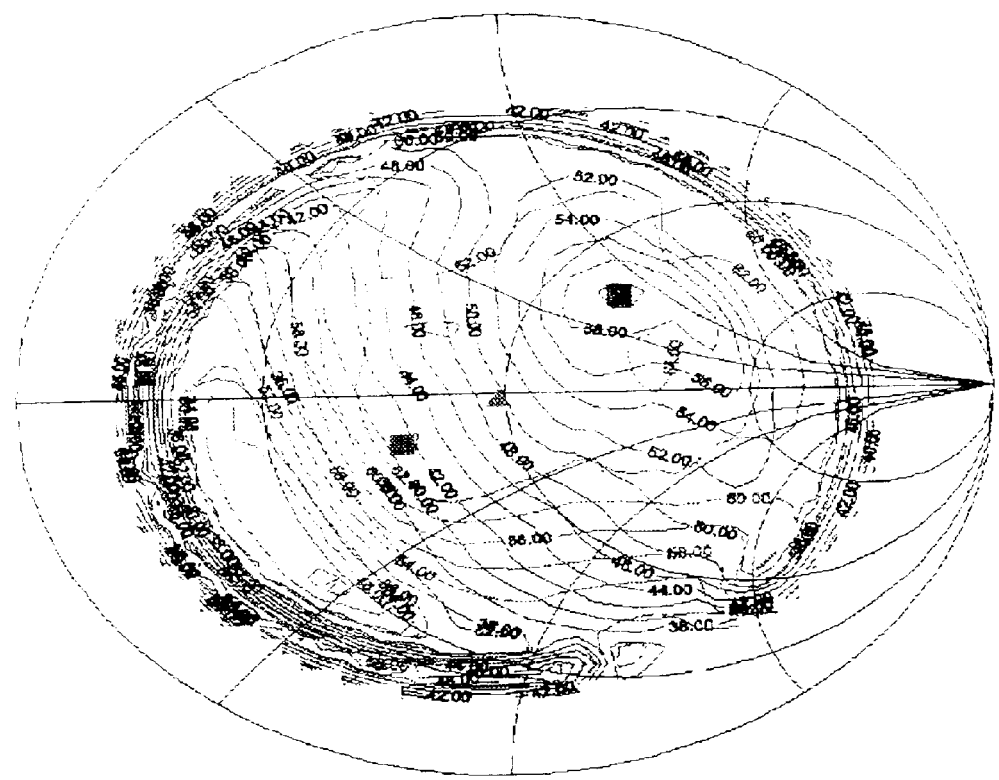
FIG. 3 is a diagram illustrating a Smith chart representing an ACPR (Adjacent Channel Power Ratio) characteristic out of load full data of an RF power amplifier, specifically Model No. RI23124.
Figure 4:
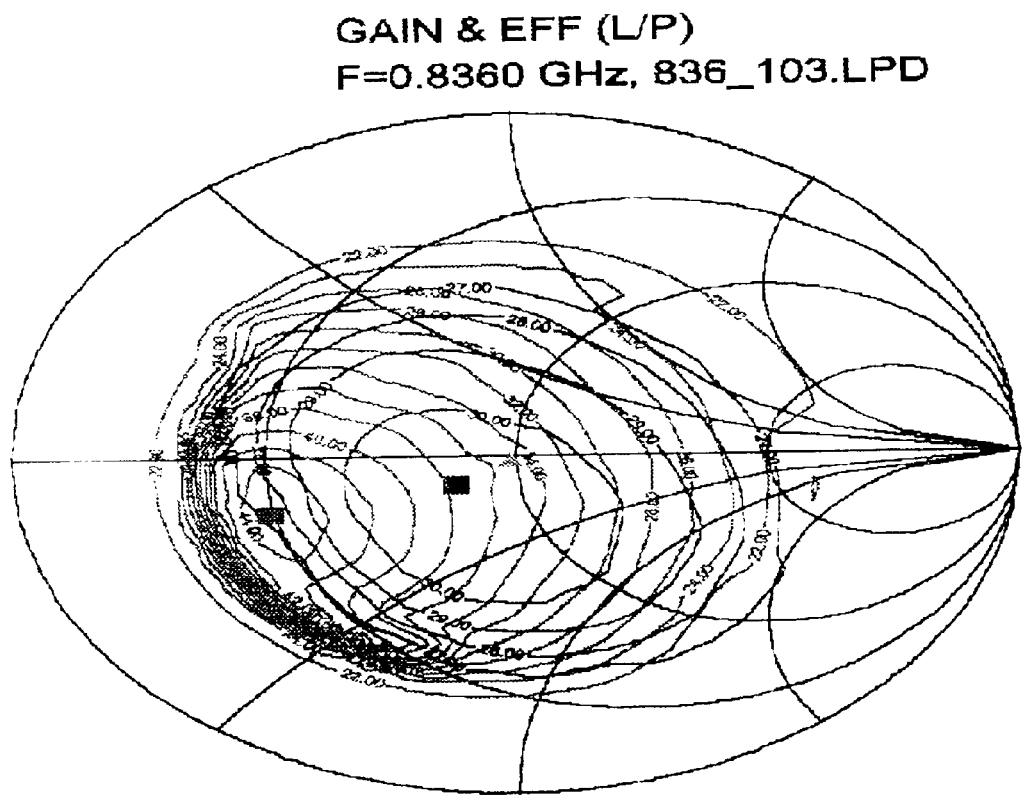
FIG. 4 is a diagram illustrating a Smith chart representing a power rate characteristic out of the load full data of the RF power amplifier Model No. RI23124.

FIGS. 3 and 4 illustrate Smith charts representing load full data of the RF power amplifier RI23124.

Referring to FIG. 3, the maximum ACPR characteristic appears in the first quadrant. Referring to FIG. 4, the maximum power rate characteristic appears in the third quadrant. A quadrant is defined when a horizontal line and a vertical line are drawn through a medium point depicted in the drawings by a triangle.

Turning back to FIG. 2, when the CDMA mode is selected, the RF switch 40 is turned OFF, so that the load impedance of the RF power amplifier 10 is located in the first quadrant due to an inductor 25. At this point, it is possible to satisfy the ACPR characteristic by properly controlling an inductance of the inductor 25. Capacitor 35 is connected between RF switch 40 and a contact point formed between the output end of the RF amplifier 10 and Isolator 50, for matching the output impedance of the RF power amplifier in an AMPS mode of operation.

On the contrary, when the AMPS mode is selected, the RF switch 40 is turned ON, so that the load impedance of the RF power amplifier 10 is located in the third quadrant, thus increasing the power rate.

As shown in Table 1 below, when the load impedance of the RF power amplifier is 50 Ω (i.e., when the isolator 50 is directly connected to the RF power amplifier 10), the RF power amplifier consumes a current of 574 mA. However, when the load impedance is so modified as to increase the power rate by 5%, the RF power amplifier consumes a current of 509 mA. That is, it is possible to reduce the current by 65 mA (234 mW) by simply modifying the load impedance to increase the power rate by 5%.

TABLE 1

|  | Pout | Current | Power Rate | Remarks |
|---|---|---|---|---|
| Load of 50Ω | 29.171 | 574 mA | 40% | Measured Value |
| Load Modified | 29 | 509 mA | 45% | Measured Value |

If the loss of the isolator 50 and the duplexer 60 is 2.5 dBm when the output power Pout of the power amplifier is 29 dBm, the final output power becomes 26.5 dBm. This is equivalent to that of AMPS PL2 (Power Level 2).

As described above, the dual mode mobile phone with the power rate enhancement circuit, according to the present invention, satisfies the CDMA and AMPS mode characteristics using only a single RF power amplifier without a separate RF power amplifier for the AMPS mode, thereby reducing the power consumption. As a result, the battery run-time of the dual mode mobile phone is extended and the power rate is increased. Further, the heat generated by the dual mode mobile phone RF power is reduced.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A power rate enhancement circuit for a power amplifier in a dual mode mobile phone including an RF (Radio Frequency) power amplifier for amplifying an RF input signal, a duplexer connected to an antenna, and an isolator connected to the duplexer, the circuit comprising:

a CDMA (Code Division Multiple Access) matching circuit connected to an output end of the RF power amplifier, for matching an output impedance of the RF power amplifier in a CDMA mode of operation;

an AMPS (Advanced Mobile Phone Service) matching circuit connected to the output end of the RF power amplifier, for matching the output impedance of the RF power amplifier in an AMPS mode of operation; and an RF switch for selecting one of the CDMA matching circuit or the AMPS matching circuit, according to a mode control signal, wherein the CDMA matching circuit comprises an inductor connected between the output end of the RF power amplifier and an isolator, and the AMPS matching circuit comprises a capacitor connected between the RF switch and a contact point formed between the inductor and the isolator.

2. The power rate enhancement circuit as claimed in claim 1, wherein the RF switch is a mechanical switch.

3. The power rate enhancement circuit as claimed in claim 1, wherein the RF switch is a field effect transistor.

4. The power rate enhancement circuit as claimed in claim 1, wherein the RF switch is a diode.

5. A power rate enhancement circuit for a power amplifier in a dual mode mobile phone including an RF power amplifier for amplifying an RF input signal, a duplexer connected to an antenna, and an isolator connected to the duplexer, the circuit comprising:

an inductor connected between an output end of the RF amplifier and the isolator, for matching an output impedance of the RF power amplifier in a CDMA mode of operation;

a capacitor connected between an RF switch and a contact point formed between the inductor and the isolator, for matching the output impedance of the RF power amplifier in an AMPS mode of operation; and the RF switch for selecting one of the inductor or the capacitor, according to a mode control signal.

6. The power rate enhancement circuit as claimed in claim 5, wherein the RF switch is a mechanical switch.

7. The power rate enhancement circuit as claimed in claim 5, wherein the RF switch is a field effect transistor.

8. The power rate enhancement circuit as claimed in claim 5, wherein the RF switch is a diode.

* * * * *